(12) United States Patent
Hayashi

(10) Patent No.: US 9,703,190 B2
(45) Date of Patent: Jul. 11, 2017

(54) IMPRINT METHOD, IMPRINT APPARATUS, AND ARTICLE MANUFACTURING METHOD

(71) Applicant: CANON KABUSHIKI KAISHA, Tokyo (JP)

(72) Inventor: Nozomu Hayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/380,797

(22) PCT Filed: Mar. 7, 2013

(86) PCT No.: PCT/JP2013/001446
§ 371 (c)(1),
(2) Date: Aug. 25, 2014

(87) PCT Pub. No.: WO2013/136733
PCT Pub. Date: Sep. 19, 2013

(65) Prior Publication Data
US 2015/0013559 A1    Jan. 15, 2015

(30) Foreign Application Priority Data

Mar. 12, 2012  (JP) .................................. 2012-053991
Mar. 5, 2013   (JP) .................................. 2013-042700

(51) Int. Cl.
*B41F 1/18*     (2006.01)
*G03F 7/00*     (2006.01)
*G03F 9/00*     (2006.01)

(52) U.S. Cl.
CPC .......... *G03F 7/0002* (2013.01); *G03F 9/7038* (2013.01); *G03F 9/7088* (2013.01)

(58) Field of Classification Search
CPC ........ B41M 1/06; B82Y 40/00; G03F 9/7049; G03F 7/0002; G03F 9/7038; G03F 9/7088
See application file for complete search history.

(56) References Cited

U.S. PATENT DOCUMENTS

| 8,248,608 B2 * | 8/2012 | Den Boef ...................... 356/401 |
| 2006/0157444 A1 * | 7/2006 | Nakamura et al. ............ 216/54 |

(Continued)

FOREIGN PATENT DOCUMENTS

| JP | 2006165371 A | 6/2006 |
| JP | 2007165400 A | 6/2007 |

(Continued)

OTHER PUBLICATIONS

International Search Report issued in PCT/JP2013/001446, dated May 21, 2013.

(Continued)

*Primary Examiner* — Matthew G Marini
(74) *Attorney, Agent, or Firm* — Rossi, Kimms & McDowell LLP

(57) ABSTRACT

The imprint method includes changing the position of a detector that detects an alignment mark formed on a shot on a substrate; bringing a pattern formed on a mold into contact with an imprint material supplied on the shot on the substrate; and detecting the alignment mark using the detector after completion of the change in the position of the detector. Here, the contacting is started prior to completion of the change in the position of the detector.

13 Claims, 5 Drawing Sheets

(56) References Cited

U.S. PATENT DOCUMENTS

| | | | |
|---|---|---|---|
| 2007/0132157 A1 | 6/2007 | Tokita et al. | |
| 2010/0031833 A1 | 2/2010 | Kasumi et al. | |
| 2010/0148397 A1 | 6/2010 | Nakamura et al. | |
| 2010/0270705 A1 | 10/2010 | Okushima et al. | |
| 2011/0151124 A1 | 6/2011 | Ina | |
| 2011/0278768 A1* | 11/2011 | Sato | 264/406 |
| 2011/0290136 A1 | 12/2011 | Koga | |

FOREIGN PATENT DOCUMENTS

| | | | |
|---|---|---|---|
| JP | 2007281072 A | 10/2007 |
| JP | 2008244441 A | 10/2008 |
| JP | 2010040879 A | 2/2010 |
| JP | 2011035408 A | 2/2011 |

OTHER PUBLICATIONS

Notification of Transmittal of the International Search Report and the Written Opinion of the International Searching Authority, or the Declaration issued in PCT/JP2013/001446, dated May 21, 2013.
European Search Report issued in counterpart application No. EP13760289.2, dated Oct. 21, 2015.
Notice of Allowance issued in Korean Application No. KR10-2014-7025332, mailed Aug. 22, 2016.

* cited by examiner

IMPRINT METHOD, IMPRINT APPARATUS, AND ARTICLE MANUFACTURING METHOD

TECHNICAL FIELD

The present invention relates to an imprint method and an imprint apparatus, and an article manufacturing method using the same.

BACKGROUND ART

As the demand for microfabrication of semiconductor devices or MEMS increases, not only a conventional photolithography technology but also a microfabrication technology in which an uncured resin on a substrate (wafer) is molded by a mold to thereby form a resin pattern on the substrate have been receiving attention. This technology is also referred to as an "imprint technology", by which a fine structure with dimensions of a few nanometers can be formed on a substrate. One example of imprint technologies includes a photo-curing method. An imprint apparatus employing the photo-curing method first applies an ultraviolet curable resin (imprint material, photocurable resin) to a shot region (imprint region) on a substrate. Next, the resin (uncured resin) is molded by a mold. After the ultraviolet curable resin is irradiated with ultraviolet light for curing, the cured resin is released from the mold, whereby a resin pattern is formed on a substrate. In particular, the imprint apparatus disclosed in Patent Literature 1 causes an alignment detection system to detect a shot that is present on the peripheral region of a substrate, on which no alignment mark is missing from among the alignment marks on shots, in advance when a pattern is formed on the shots (peripheral shots) present on the peripheral region of the substrate.

CITATION LIST

Patent Literature

Patent Literature 1: Japanese Patent Laid-Open No. 2007-281072

Here, the shape of the peripheral shot is different for each peripheral shot. Thus, the position of an alignment mark to be detected by an alignment detection system also differs for each peripheral shot. In the imprint apparatus disclosed in Patent Literature 1, the operation of performing alignment measurement and bringing an imprint material into contact with a mold is started after movement (alignment) of the alignment detection system to the detection position.

Therefore, the alignment detection system needs to move for the detection of an alignment mark, and its movement time results in an adverse effect on throughput.

SUMMARY OF INVENTION

Accordingly, the present invention provides an imprint method that is advantageous for improving throughput.

According to an aspect of the present invention, an imprint method for bringing an imprint material on a substrate into contact with a pattern formed on a mold to thereby transfer the pattern to the imprint material is provided that includes the steps of changing the position of a detector that detects an alignment mark formed on a shot on the substrate; bringing the pattern formed on the mold into contact with the imprint material supplied on the shot on the substrate; and detecting the alignment mark using the detector after completion of the change in the position of the detector, wherein the contacting is started prior to completion of the change in the position of the detector.

According to the present invention, an imprint method that is advantageous for improving throughput may be provided.

Further features of the present invention will become apparent from the following description of exemplary embodiments with reference to the attached drawings.

DESCRIPTION OF EMBODIMENTS

Hereinafter, preferred embodiments of the present invention will be described with reference to the drawings.

Figure 1:
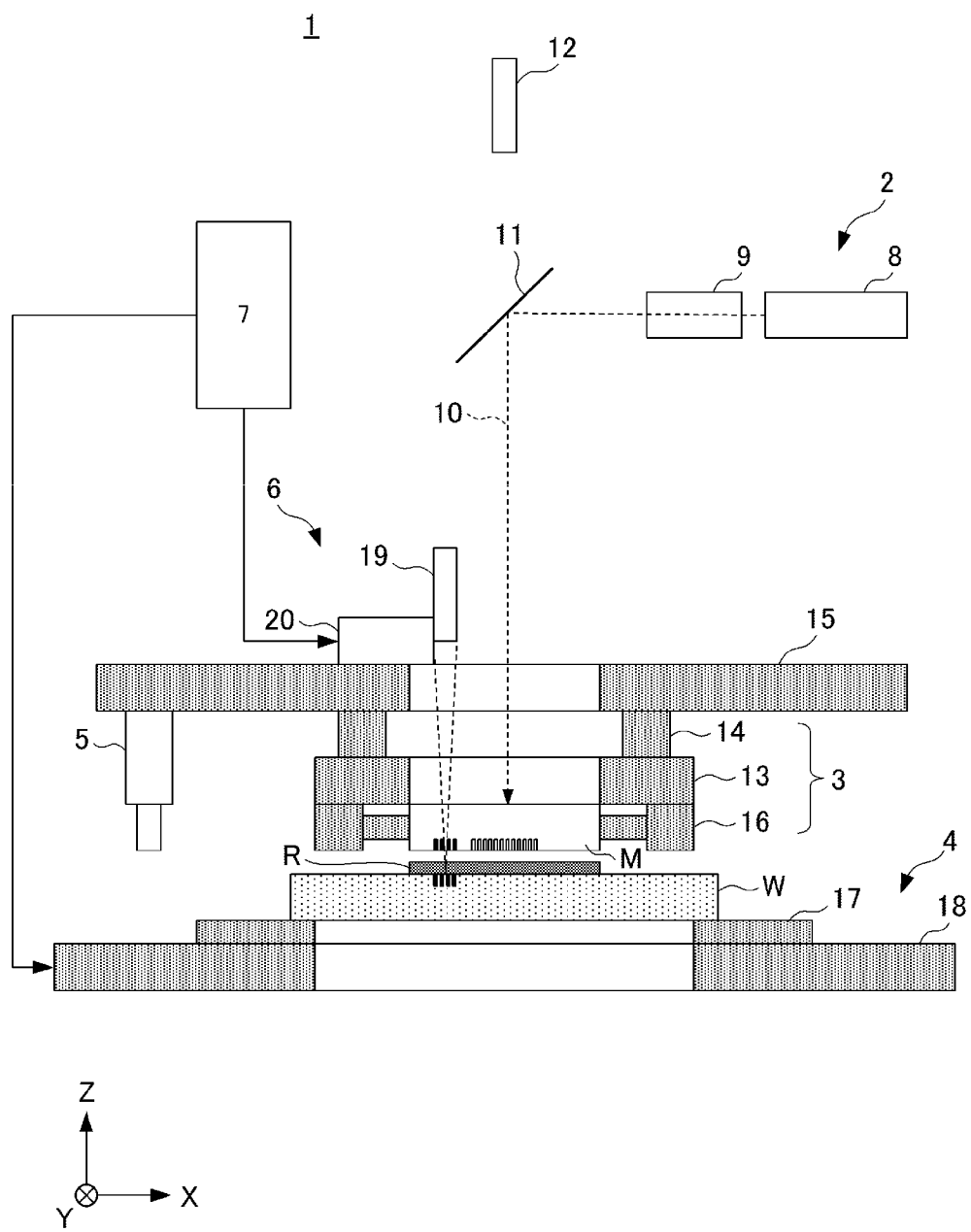
FIG. 1 is a diagram illustrating the configuration of an imprint apparatus according to one embodiment of the present invention.

Firstly, a description will be given of the configuration of an imprint apparatus according to one embodiment of the present invention. FIG. 1 is a schematic diagram illustrating the configuration of an imprint apparatus 1 of the present embodiment. The imprint apparatus 1 is an apparatus that molds an uncured resin (imprint material) on a wafer (on a substrate), i.e., a substrate to be treated, using a mold to thereby form a resin pattern on the wafer, which is used in the manufacture of devices such as semiconductor devices and the like as articles. Here, the imprint apparatus of the present embodiment is an imprint apparatus employing a photo-curing method for curing a resin by the irradiation of ultraviolet light. The imprint apparatus 1 sequentially forms a pattern on a plurality of shots (pattern-forming regions) present on a wafer by repeating an imprint cycle. Here, the imprint cycle refers to a cycle for forming a pattern on one shot on a wafer by curing a resin while a mold is being pressed against the resin on the wafer (while a mold is brought into contact with the resin on the wafer). In the following drawings, a description will be given where the Z axis is aligned parallel to the optical axis of an irradiation system that irradiates a resin on a wafer with ultraviolet light, and mutually orthogonal axes X and Y are aligned in a plane perpendicular to the Z axis. The imprint apparatus 1 includes a light irradiation unit 2, a mold holding mechanism 3, a wafer stage 4, a dispenser 5, an alignment detection system 6, and a controller 7.

The light irradiation unit 2 irradiates a resin R with the ultraviolet light 10 via a mold M to thereby cure the resin R. The resin R in the present embodiment is an ultraviolet curable resin. The light irradiation unit 2 includes a light source unit 8 and an optical system 9. The light source unit 8 includes a light source (not shown) such as a halogen lamp for emitting the ultraviolet light 10 (e.g., i-rays, g-rays) and an elliptical mirror (not shown) for collecting light emitted from the light source. The optical system 9 includes a lens and an aperture (not shown) used for irradiating the resin R on a shot with the ultraviolet light 10, and a half mirror 11. The aperture is used for field angle control and outer peripheral light-shielding control. With the aid of the field angle control, only a target shot can be irradiated with the ultraviolet light 10. With the aid of the outer peripheral light-shielding control, the ultraviolet light 10 can be limited so as not to exceed the external shape of a wafer W. The optical system 9 may also include an optical integrator for uniformly illuminating the mold M. The ultraviolet light 10 of which the illumination range has been defined by the aperture is incident on the resin R on the wafer W via the mold M. Furthermore, in the present embodiment, the imprint apparatus 1 includes an observation scope 12 that observes the entire shot via the half mirror 11. The observation scope 12 is used for confirming the state of imprint processing (a pressing operation and progress state of filling).

The outer peripheral shape of the mold M is a polygon (preferably, rectangular or square) and the mold M includes a pattern section (e.g., the concave and convex pattern of a circuit pattern or the like to be transferred) which is three-dimensionally formed on the surface facing the wafer W. In order to pass through the ultraviolet light 10 for curing the resin R, the mold M is formed of any material which is transparent to wavelengths of the ultraviolet light 10, such as quartz.

The mold holding mechanism 3 includes a mold chuck 13 that holds the mold M and a mold drive mechanism 14 that moves the mold chuck 13 (the mold M). The mold drive mechanism 14 is supported on the bridge surface plate 15. The mold drive mechanism 14 includes a positioning mechanism that controls the position of the mold M in the directions of six axes and a mechanism that presses the mold M against the resin R on the wafer W and releases the mold M from the cured resin R. Here, the six axes refer to the X axis, the Y axis, the Z axis, and the rotation direction of each axis in the XYZ coordinate system where the support plane of the mold chuck 13 (plane for supporting the wafer W) is aligned to the XY-plane and the direction orthogonal to the XY-plane is aligned to the Z axis. Furthermore, the mold holding mechanism 3 includes a magnification correction mechanism (shape correction mechanism) 16 that is installed on the mold chuck 13. The magnification correction mechanism 16 corrects the shape of the mold M by applying pressure to the mold M from the outer peripheral direction using, for example, a cylinder that operates with a fluid such as air or oil. Also, the magnification correction mechanism 16 corrects the shape of the mold M by controlling the temperature of the mold M using a temperature controller that controls the temperature of the mold M. The wafer W is deformed (in general, expanded or contracted) by carrying out the process such as heat treatment. Accordingly, the magnification correction mechanism 16 corrects the shape of the mold M depending on the deformation of the wafer W described above such that an overlay error falls within an allowable range.

The wafer W is, for example, a single crystal silicon substrate, an SOI (Silicon on Insulator) substrate, or a glass substrate. The pattern (pattern-including layer) of the resin R is formed on a plurality of shots on the wafer W by a pattern section (the pattern (hereinafter referred to as a "wafer W-side pattern") has already been formed in the previous step before the wafer W is conveyed into the imprint apparatus 1).

The wafer stage (substrate holding unit) 4 includes a wafer chuck 17 that holds the wafer W by sucking it by vacuum suction and a stage drive mechanism 18 that moves the wafer chuck 17 (the wafer W). As in the mold drive mechanism 14, the stage drive mechanism 18 includes a positioning mechanism that controls the position of the wafer W by controlling the position of the wafer chuck 17 in the directions of six axes.

The dispenser 5 applies the resin R to a shot on the wafer W. The dispenser 5 includes a tank that contains therein the resin R, a nozzle that discharges the resin R supplied from the tank via a supply passage to the wafer W, a valve provided on the supply passage, and a supply amount controller, all of which are not shown. In general, the supply amount controller is configured to control the valve such that the resin R is applied to one shot in a single discharge operation for discharging the resin R to thereby adjust the supply amount of the resin R to the wafer W.

The alignment detection system 6 includes a plurality of (in this case, four) alignment scopes (detectors) 19 and an alignment stage mechanism 20. The alignment scope 19 detects an alignment mark AMM formed on the mold M and an alignment mark AMW formed on the wafer W via the mold M so as to perform positioning between the mold M and the wafer W. The alignment stage mechanism 20 is mounted on the bridge surface plate 15 and can move a plurality of the alignment scopes 19 independently so as to change the detection position to be detected by each alignment scope 19.

Figure 2A:
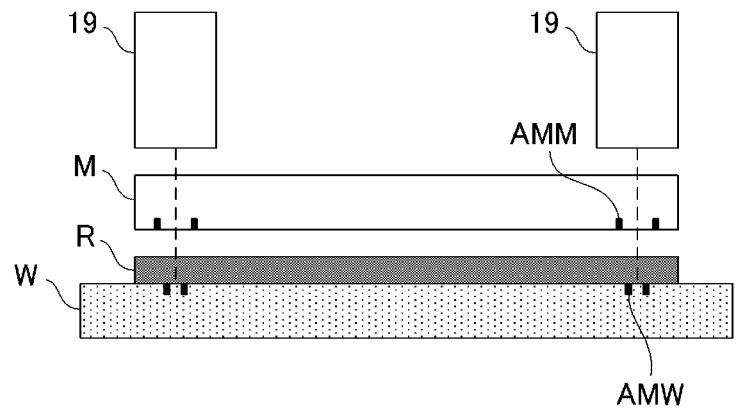
FIG. 2A is a diagram illustrating the arrangement of an alignment scope.
Figure 2B:
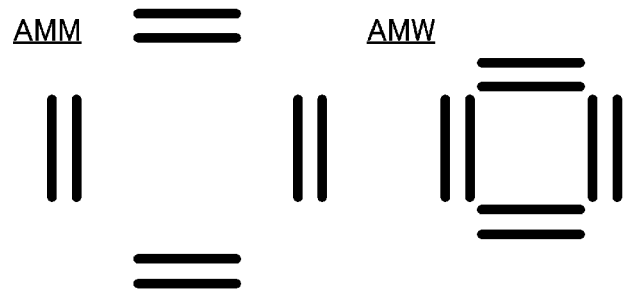
FIG. 2B is an enlarged view illustrating an alignment mark as viewed from the ultraviolet light incident side.
Figure 2C:
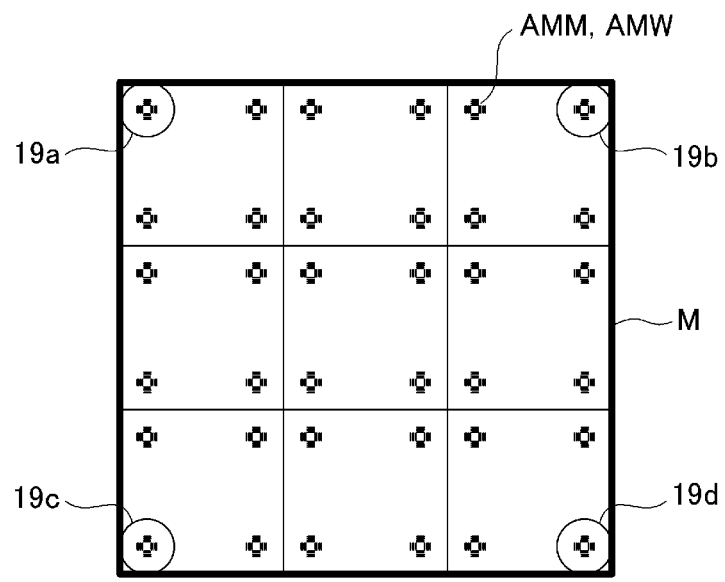
FIG. 2C is a diagram illustrating a plurality of alignment marks as viewed from the ultraviolet light incident side.
Figure 3:
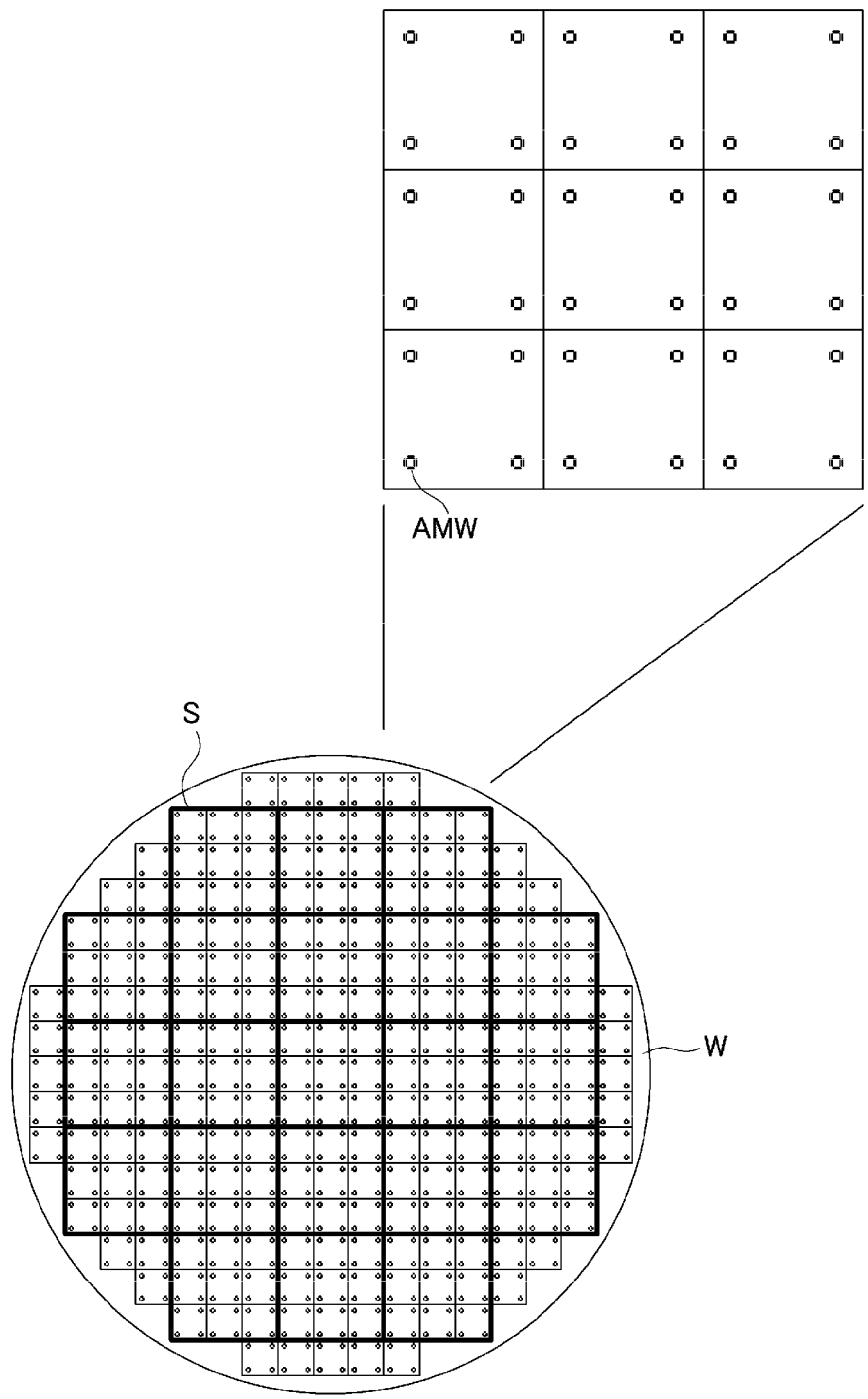
FIG. 3 is a diagram illustrating alignment of peripheral shots on a wafer.

FIGS. 2A to 2C are diagrams illustrating the arrangement of the alignment scope 19, and a mold-side alignment mark AMM formed on the mold M and a wafer-side alignment mark AMW formed on the wafer W. In particular, FIG. 2A is a schematic cross-sectional view illustrating the arrangement of the alignment scopes 19, the mold M, the resin R, and the wafer W. FIG. 2B is an enlarged view illustrating the alignment marks AMM and AMW as viewed from the ultraviolet light incident side. The alignment mark AMM and the alignment mark AMW are arranged so as not to overlap with each other as viewed from the ultraviolet light incident side to the mold M in the state shown in FIG. 2A. Furthermore, FIG. 2C is a schematic plan view illustrating the arrangement of a plurality of alignment marks AMM and AMW as viewed from the ultraviolet light incident side to the mold M. In particular, the regions 19a to 19d at the four corners of the mold M are regions that are the positions (detection positions) to be (specifically) detected by the alignment scopes 19. On the other hand, FIG. 3 is a plan view illustrating the arrangement of shots on the wafer W. The wafer W includes a plurality of shots S on the surface thereof, and a plurality of alignment marks AMW is formed in each shot S.

Figure 4:
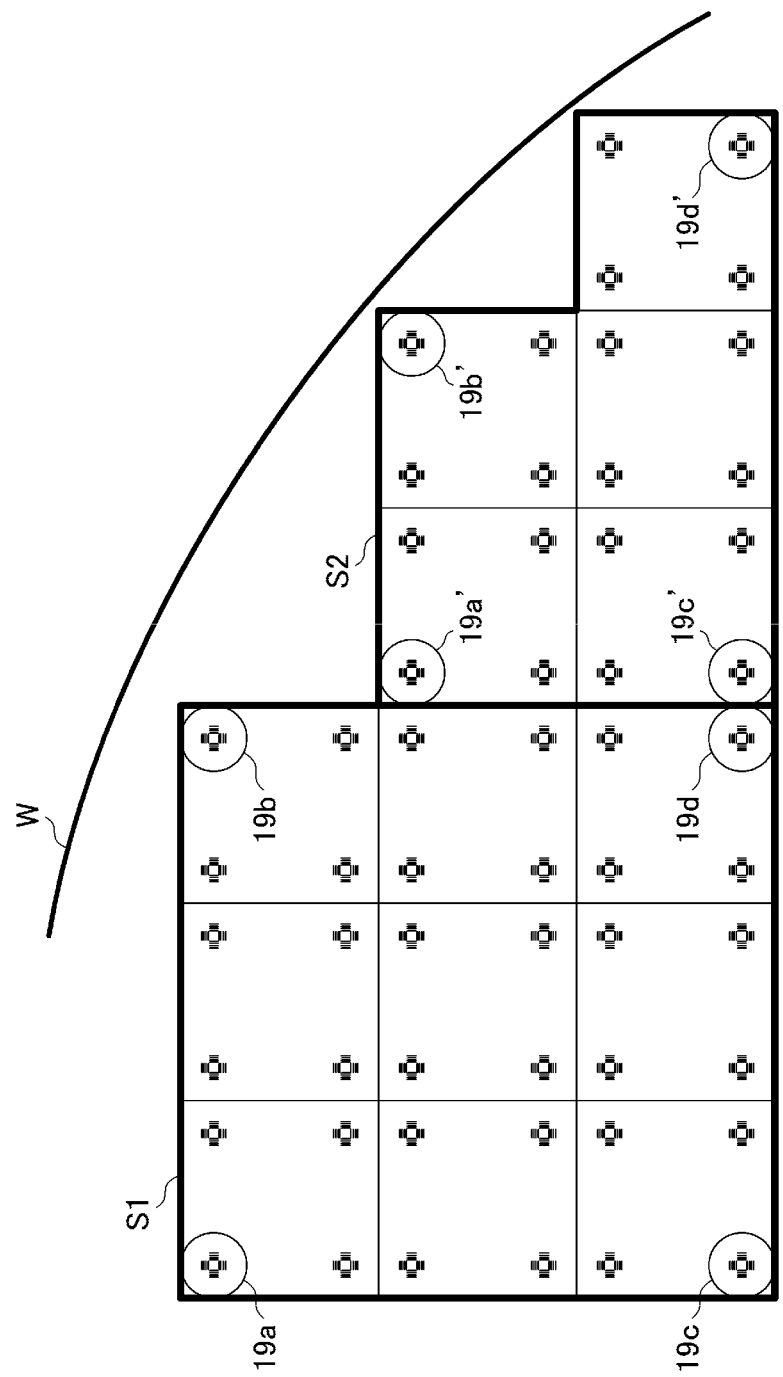
FIG. 4 is a diagram illustrating the arrangement of shots on a wafer.

FIG. 4 is a diagram illustrating the alignment of peripheral shots on the wafer. The shot S present on the wafer W is basically rectangular as shown in a shot S1 in FIG. 4. However, the entire one shot does not fall within the wafer W in the periphery of the wafer W, and thus, the shot S2 has a different shape from that of the shot S1. Accordingly, in the present embodiment, the positions of the alignment scopes 19 are the regions 19a' to 19d' with respect to the peripheral shot S2 that is present in the periphery of the wafer W as described above, and the detail of which will be described below.

The controller 7 may control the operation, adjustment, and the like of the components of the imprint apparatus 1. The controller 7 is constituted by a computer or the like and is connected to the components of the imprint apparatus 1 through a line so as to execute control of the components by a program or the like. The controller 7 of the present embodiment controls at least the operation of the alignment detection system 6 and the wafer stage 4. Note that the controller 7 may be integrated with the rest of the imprint apparatus 1 (provided in a shared housing) or may be provided separately from the rest of the imprint apparatus 1 (provided in a separate housing).

Furthermore, the imprint apparatus 1 includes a surface plate (not shown) for forming a reference plane on which the wafer stage 4 is placed, a bridge surface plate 15 that fixes the mold holding mechanism 3, and a column that extends from the surface plate and supports the bridge surface plate 15 via a vibration isolator that isolates vibration from a floor. Furthermore, the imprint apparatus 1 may include a mold conveyance mechanism that conveys into/out the mold M between the exterior of the imprint apparatus 1 and the mold holding mechanism 3 and a substrate conveyance mechanism that conveys into/out the wafer W between the exterior of the imprint apparatus 1 and the wafer stage 4, and the like, and none of which is shown.

Figure 5:
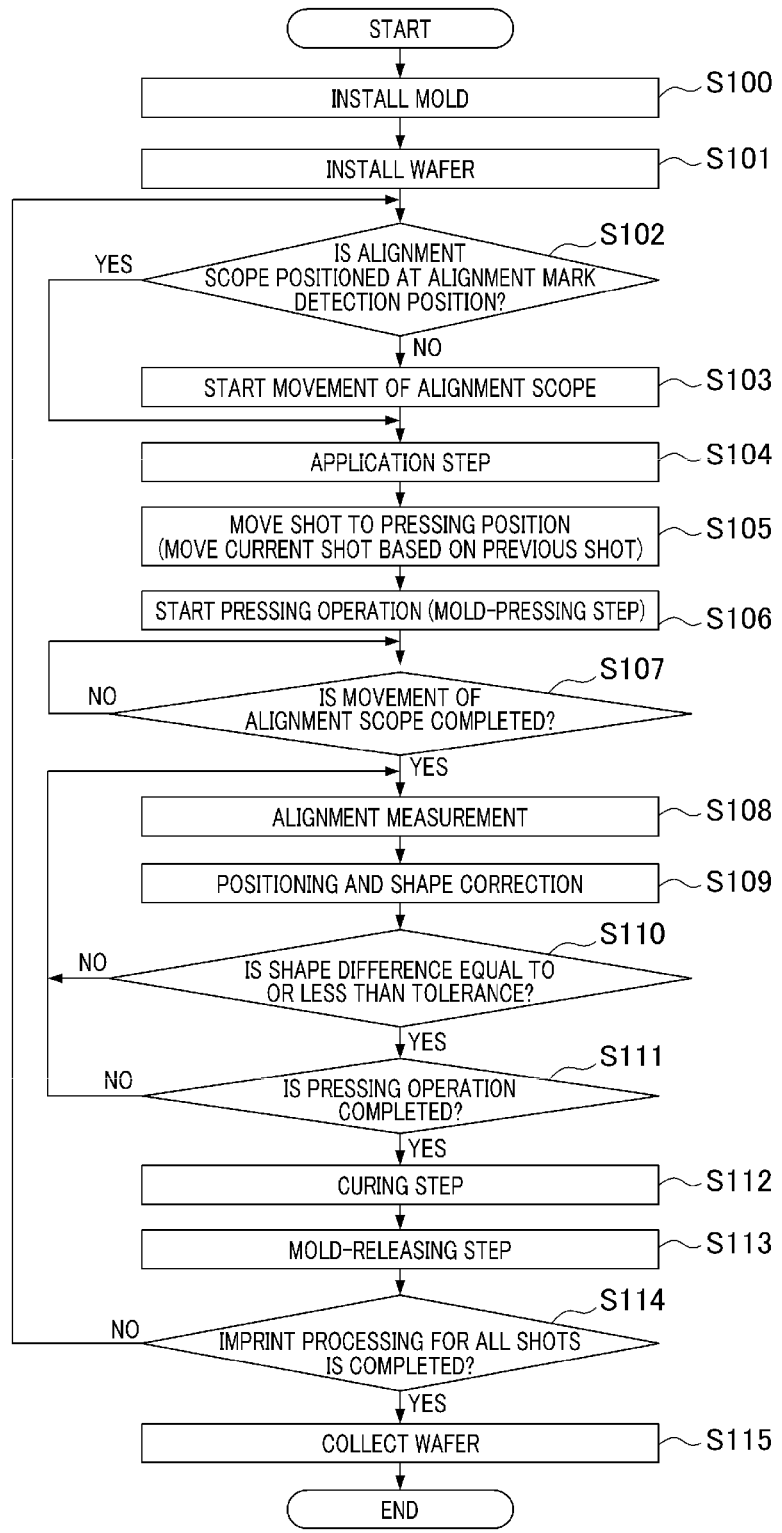
FIG. 5 is a flowchart illustrating the sequence of operations during imprint processing.

Next, a description will be given of an imprint method performed by the imprint apparatus 1. FIG. 5 is a flowchart illustrating the sequence of operations of a series of imprint processing performed by the imprint apparatus 1. Firstly, the controller 7 causes the mold conveyance mechanism to convey the mold M to the mold chuck 13 and causes the mold chuck 13 to hold the mold M after positioning (step S100). Here, after installation of the mold M, the controller 7 causes the alignment stage mechanism 20 to move the alignment scope 19. In particular, in the present embodiment, the controller 7 performs control to operate the alignment scope 19 such that the detection position of the alignment scope 19 is positioned at the alignment marks AMW which are present at the four corners (the regions 19a to 19d) of the shot as shown in FIG. 2C (the shot S1 as shown in FIG. 4). Next, the controller 7 causes the substrate conveyance mechanism to convey the wafer W to the wafer chuck 17 and then causes the wafer chuck 17 to hold the wafer W (step S101). It should be noted that at least one layer pattern has already been formed together with the alignment marks AMW on each shot on the wafer W.

Next, the controller 7 causes the alignment detection system 6 to measure the relative position between the alignment marks AMM on the mold M and the alignment marks AMW on the wafer W. At this time, the controller 7 determines whether or not the alignment scope 19 is positioned at the detection position of each alignment mark AMM on the mold M, i.e., at the position corresponding to the regions 19a to 19d (step S102). In normal measurement for measuring the shot S1 as shown in FIG. 4 upon installation of the mold M, the position of the alignment scope 19 is matched with the regions 19a to 19d as it is. Thus, when the controller 7 determines in step S102 that the position of the alignment scope 19 is located on the regions 19a to 19d (YES), the process shifts to the following step S104 because the controller 7 is capable of being put into alignment measurement without changing the position of the alignment scope 19. In contrast, when the position of the alignment scope 19 remains the same upon measurement of the peripheral shot S2 as shown in FIG. 4, there is no alignment mark AMW corresponding to two regions 19a and 19b on the shot S2, and thus, the positions of the two regions 19a and 19b cannot be measured. Thus, when the controller 7 determines in step S102 that the position of the alignment scope 19 is not located on the regions 19a to 19d (NO), the controller 7 causes the alignment stage mechanism 20 to start movement of the alignment scope 19 (step S103). At this time, the detection position of the alignment mark AMW can be changed. Thus, it is preferable that the controller 7 performs control to select the alignment marks AMW, which are present at positions where the distance between the alignment marks AMW can be set as wide as possible, from among a plurality of alignment marks AMW present within the peripheral shot S2. For example, in the case of the peripheral shot S2 shown in FIG. 4, four alignment marks AMW corresponding to the regions 19a' to 19d' are the preferable alignment marks.

Next, the controller 7 causes the stage drive mechanism 18 to move the wafer W so as to make a shot to be processed this time position at the application position of the dispenser 5 and causes the dispenser 5 to apply the resin R to the wafer W (step S104: application step). Here, when the alignment scope 19 has been moved in step S103, it is preferable that the controller 7 performs control to move the alignment scope 19 concurrently with the movement of the wafer W to the application position.

Next, the controller 7 causes the stage drive mechanism 18 to move the wafer W such that the shot is positioned at a position where the wafer W is pressed against the mold M (step S105). Here, when the alignment scope 19 has been moved in step S103, the controller 7 cannot immediately perform alignment processing because there is a possibility at this stage that the alignment scope 19 that has started to move in step S103 is still in the middle of movement. However, the pressing operation of pressing the mold M against the resin R on the wafer W in the following mold-pressing step is not necessarily performed after alignment processing is strictly performed, that is, after the alignment marks AMM on the mold M are strictly matched with the alignment marks AMW on the wafer W. This is because, if the resin R is not yet cured even during the pressing operation of pressing the mold M against the resin R on the wafer W, the controller 7 can performs strict alignment processing during the pressing operation so as to deform (correct) the shape of the resin R at that time as appropriate. In the present embodiment, the controller 7 causes the stage drive mechanism 18 to move the wafer W with reference to a shot position obtained when alignment processing is performed for a shot previously processed. Next, the controller 7 performs control to start a pressing operation (step S106: mold-pressing step). More specifically, when the shot S1 subjected to imprint processing is present prior to imprint processing for the current shot S2, the controller 7 may perform control to start the pressing operation at a position where the wafer W is shifted by the size of one shot on the basis of the alignment of the shot S1. Here, the pressing operation is performed by the controller 7 by causing the mold drive mechanism 14 to lift down the mold M toward the resin R on the wafer W. Note that the controller 7 may perform the pressing operation for pressing the mold M against the resin R by lifting up the wafer W instead of driving the mold M. Also, the controller 7 may control a pressing load by using a load sensor incorporated in the mold drive mechanism 14.

Next, when the alignment scope 19 has been moved in step S103, the controller 7 determines whether or not the movement of the alignment scope 19 is completed (step S107). Here, when the controller 7 determines that the movement of the alignment scope 19 is not completed (NO), the controller 7 performs control to continue determination processing until the movement of the alignment scope 19 is completed. On the other hand, when the controller 7 determines that the movement of the alignment scope 19 is completed (YES) and when the movement of the alignment scope 19 is absent in step S103, the controller 7 causes the alignment scope 19 to perform alignment measurement in a dye-by-dye alignment method (step S108). Here, the controller 7 causes the alignment scope 19 to capture images of the alignment marks AMM on the mold M and the alignment marks AMW on the wafer W and causes an image processing apparatus (not shown) to measure the relative position between the alignment marks AMM and AMW. Then, the controller 7 computes the difference (coordinate component, rotation component, magnification component, trapezoidal component, and the like) of shot shapes between the mold M and the wafer W based on the results of detection at four positions corresponding to the regions 19a to 19d (or the regions 19a' to 19d').

Next, the controller 7 causes the magnification correction mechanism 16 to correct the shape of the mold M so as to match the shape of the pattern section formed on the mold M with the shape of the shot on the wafer W as appropriate concurrently with positioning of the wafer W relative to the mold M (step S109). The controller 7 then performs shape difference tolerance determination because a correction error may occur due to driving error in driving the magnification correction mechanism 16 (step S110). Here, when the controller 7 determines that the shape difference is equal to or greater than a tolerance level (NO), the process returns to step S108, and the controller 7 causes the alignment scope 19 to perform alignment measurement again and causes the magnification correction mechanism 16 to correct the shape of the mold M until the shape difference is equal to or less than a predetermined tolerance level. On the other hand, when the controller 7 determines in step S110 that the shape difference is equal to or less than a tolerance level (YES), the controller 7 determines whether or not the pressing operation is completed (whether or not the filling of the resin R in the mold M is completed) (step S111). Here, when the controller 7 determines that the filling of the resin R in the mold M is not completed (NO), the process returns to step S108 again and the controller 7 causes the alignment scope 19 to perform alignment measurement.

Next, upon completion of the filling of the resin R in the mold M (YES in step S111), the controller 7 causes the light irradiation unit 2 to irradiate the resin R on the wafer W with the ultraviolet light 10 via the mold M to thereby cure the resin R (step S112: curing step). After the resin R is cured, the controller 7 causes the mold drive mechanism 14 to raise the mold M to thereby release the mold M from the cured resin R (step S113: mold-releasing step).

Next, the controller 7 determines whether or not imprint processing (pattern-forming step) has been completed for all the shots on the wafer W (step S114). Here, when the controller 7 determines that there is still a shot not subjected to imprint processing (NO), the process returns to step S102 and the controller 7 performs control to repeat imprint processing for the next shot. On the other hand, when the controller 7 determines that imprint processing has been completed for all the shots on the wafer W (YES in step S114), the controller 7 causes the substrate conveyance mechanism to collect the wafer W from the wafer chuck 17 (step S115), and all the processing ends.

As described above, when a shot to be processed is a peripheral shot and alignment processing is performed for the peripheral shot, the controller 7 causes the alignment scope 19 to move to a position at which a detectable alignment mark is present. In this manner, the imprint apparatus 1 may perform accurate alignment processing even when a shot to be processed is a peripheral shot. However, if the mold-pressing step (pressing operation) is performed after waiting for the completion of the movement of the alignment scope 19, the time required for the entire imprint processing is prolonged, resulting in a decrease in throughput. Thus, in the present embodiment, the controller 7 simultaneously performs control to start the application step and the next mold-pressing step immediately after the start of the movement of the alignment scope 19. Thus, at least a part of the movement time of the alignment scope 19 overlaps the pressing time (the filling time of the resin R), that is, is hidden within the pressing time, whereby the time required for the entire imprint processing can be shortened. In this manner, the imprint apparatus 1 can increase its throughput. Furthermore, in the present embodiment, when a shot is moved to a pressing position after the application step, the controller 7 causes the stage drive mechanism 18 to move the wafer W with reference to a shot position obtained when alignment processing is performed for a shot previously processed. In this manner, the alignment scope 19 can set the position of the wafer W to a position near the exact location even when the movement destination position is not accurately recognized. Thus, the imprint apparatus 1 can also perform the position settings in a short period of time, resulting in a further increase in throughput.

As described above, according to the present embodiment, an imprint method that is advantageous for improving throughput may be provided.

In the above embodiment, the controller 7 performs control to start the pressing operation for the next shot with reference to the shot subjected to the most-recent imprint processing. Here, For example, when imprint processing is performed for the shot S2 subsequent to the shot S1 as shown in the example in FIG. 4, no change is made on two regions 19c' and 19d'. In other words, the controller 7 performs control to move two alignment scopes 19 corresponding to the other two regions 19a' and 19b'. Thus, during that time, the alignment scopes 19 corresponding to the regions 19a' and 19b' cannot be used, whereas the alignment scopes 19 corresponding to the regions 19c' and 19d' can be used. As described above, the controller 7 is not limited to start the pressing operation with reference to all the positions on the shot subjected to the most-recent imprint processing but may also perform alignment processing using the non-move alignment scope 19 and then start the pressing operation. Then, after the movement of all the alignment scopes 19 is completed, the controller 7 may perform dye-by-dye alignment in step S108.

Furthermore, in the embodiment, the controller 7 determines whether or not the movement of the alignment scope 19 is necessary prior to the application step (step S104) of application the resin R in the imprint cycle, and performs the movement of the alignment scope 19 as appropriate. However, the controller 7 may also determine whether or not the movement of the alignment scope 19 is necessary based on the shape of the next shot after the shape difference becomes equal to or less than the tolerance level and the filling is completed. The controller 7 performs the movement of the alignment scope 19 ahead of its schedule so that the movement of the alignment scope 19 is completed at an earlier timing, whereby the total processing time required for performing imprint processing for all the shots on the wafer W can further be reduced.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other article such as a patterned medium (storage medium), an optical element, or the like is manufactured, the manufacturing method may include other step of processing the substrate on which a pattern has been formed instead of the etching step. The article manufacturing method of the present embodiment has an advantage, as compared with a conventional article manufacturing method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-053991 filed on Mar. 12, 2012, and Japanese Patent Application No. 2013-042700 filed on Mar. 5, 2013, which are hereby incorporated by reference herein in its entirety.

The invention claimed is:

1. An imprint method of forming a pattern of an imprint material on a peripheral shot region on a substrate by bringing the imprint material on the substrate into contact with part of the pattern formed on a mold, the imprint method comprising the steps of:
   changing a position of a detector that detects an alignment mark formed on peripheral shot region on the substrate;
   contacting the mold with the imprint material supplied on the peripheral shot region on the substrate; and
   detecting the alignment mark using the detector after completing the changing step,
   wherein changing of the position of the detector in the changing step is started before contacting the mold with the imprint material in the contacting step, and
   wherein the contacting of the mold with the imprint material in the contacting step is started before completing the changing of the position of the detector in the changing step.

2. The imprint method according to claim 1, further comprising the step of:
   repeatedly forming a pattern of the imprint material to a plurality of shot regions formed on the substrate,
   wherein the contacting step is started based on the result of detection obtained by detecting an alignment mark with respect to a shot region, among the plurality of shot regions, at which the pattern of the imprint material is formed on the substrate.

3. The imprint method according to claim 1, further comprising the steps of:
   repeatedly forming a pattern of the imprint material to a plurality of shot regions formed on the substrate,
   wherein the changing step changes the position of the detector from the position of a shot region, among the plurality of shot regions, to which the pattern of the imprint material has been formed to the position of a next shot region, among the plurality of shot regions, on the substrate to which the pattern is to be formed.

4. The imprint method according to claim 1, wherein the peripheral shot region is a region where the part of the pattern formed on the mold contacts with the imprint material.

5. An imprint method of bringing an imprint material on a substrate into contact with a mold to form a pattern of the imprint material, the imprint method comprising the steps of:
   changing a position of a detector that detects an alignment mark formed on a shot region on the substrate;
   contacting the mold with the imprint material supplied on the shot region on the substrate; and
   detecting the alignment mark using the detector after completing the changing step,
   wherein changing of the position of the detector in the changing step is started before contacting the mold with the imprint material in the contacting step,
   wherein the contacting of the mold with the imprint material in the contacting step is started before completing the changing of the position of the detector in the changing step,
   where the detector is provided in plural,
   wherein the position of one of the detectors is changed in the changing step and the position of another of the detectors is not changed in the changing step, and
   wherein the contacting step starts contacting the mold into the imprint material after the another detector, the position of which is not changed, detects the alignment mark, and the one detector, the position of which is changed, detects the alignment mark after completion of changing the position of the one detector, the position of which is changed.

6. The imprint method according to claim 1, further comprising the steps of:
   repeatedly forming a pattern of the imprint material to a plurality of shot regions formed on the substrate;
   curing an uncured imprint material on the peripheral shot region after completing the contacting step;
   releasing the mold from the cured imprint material; and
   detecting an alignment mark formed on a next shot region, among the plurality of shot regions, to be next processed prior to the curing or the releasing step after completion of at least either one of matching a shape of the pattern formed on the mold with the shape of the next shot region or aligning the mold with the substrate.

7. An imprint method of forming a pattern of an imprint material on a peripheral shot region on a substrate by bringing the imprint material on the substrate into contact with part of the pattern formed on a mold, the imprint method comprising the steps of:
   supplying the imprint material on the substrate;
   changing a position of a detector that detects an alignment mark formed on the peripheral shot region on the substrate;
   contacting the mold with the imprint material supplied on the peripheral shot region on the substrate; and
   detecting the alignment mark using the detector after completing the changing step,
   wherein changing of the position of the detector in the changing step is started before contacting the mold with the imprint material in the contacting step,
   wherein the contacting of the mold with the imprint material in the contacting step is started before completing the changing of the position of the detector in the changing step, and
   wherein the supplying step is performed during the changing step.

8. An imprint apparatus that forms a pattern of an imprint material on a peripheral shot region on a substrate by bringing the imprint material on the substrate into contact with part of the pattern formed on a mold, the imprint apparatus comprising:
   a detector that detects a specific alignment mark, among a plurality of alignment marks formed on the peripheral shot region on the substrate, to allow the detection position of the specific alignment mark to be changed; and a controller that starts changing the detection position of the detector before contacting the mold with the imprint material, and bringing the pattern formed on the mold into contact with the imprint material supplied on the peripheral shot region on the substrate before completing the changing of the position of the detector.

9. The imprint apparatus according to claim 8, wherein the peripheral shot region is a region where the part of the pattern formed on the mold contacts with the imprint material.

10. An article manufacturing method comprising the steps of:

forming a pattern of an imprint material on a peripheral shot region on a substrate using an imprint method of bringing the imprint material on the substrate into contact with part of the pattern formed on a mold; and processing the substrate on which the pattern has been formed in the forming step to manufacture an article, wherein the imprint method comprises the steps of:
changing a position of a detector that detects an alignment mark formed on the peripheral shot region on the substrate;
contacting the mold with the imprint material supplied on the peripheral shot region on the substrate; and
detecting the alignment mark using the detector after completing the changing step,
wherein changing of the position of the detector in the changing step is started before contacting the mold with the imprint material in the contacting step, and
wherein the contacting of the mold with the imprint material in the contacting step is started before completing the changing of the position of the detector in the changing step.

11. An article manufacturing method comprising the steps of:

forming a pattern of an imprint material on a peripheral shot region on a substrate using an imprint method of bringing the imprint material on the substrate into contact with part of the pattern formed on a mold; and processing the substrate on which the pattern has been formed in the forming step to manufacture an article, wherein the imprint method comprises the steps of:
supplying the imprint material on the substrate;
changing a position of a detector that detects an alignment mark formed on the peripheral shot region on the substrate;
contacting the mold with the imprint material supplied on the peripheral shot region on the substrate; and
detecting the alignment mark using the detector after completing the changing step,
wherein changing of the position of the detector in the changing step is started before contacting the mold with the imprint material in the contacting step, and
wherein the contacting of the mold with the imprint material in the contacting step is started before completing the changing of the position of the detector in the changing step,
wherein the supplying step is performed during the changing step.

12. An article manufacturing method comprising the steps of:

forming an imprint material pattern on a peripheral shot region on a substrate using an imprint apparatus that brings the imprint material on the substrate into contact with part of the pattern formed on a mold to thereby transfer the pattern to the imprint material; and processing the substrate on which the pattern has been formed in the forming step to manufacture an article, wherein the imprint apparatus comprises:
a detector that detects a specific alignment mark, among a plurality of alignment marks formed on the peripheral shot region on the substrate, to allow the detection position of the specific alignment mark to be changed while transferring part of the pattern formed on the mold to the imprint material; and
a controller that starts changing the detection position of the detector before contacting the mold with the imprint material, and bringing the pattern formed on the mold into contact with the imprint material supplied on the peripheral shot region on the substrate before completing the changing of the position of the detector.

13. An imprint method of bringing an imprint material on a substrate into contact with a mold to form a pattern of the imprint material, the imprint method comprising the steps of:

changing a position of a detector that detects an alignment mark formed on a shot region on the substrate;
contacting the mold with the imprint material supplied on the shot region on the substrate; and
detecting the alignment mark using the detector after completing the changing step,
wherein changing of the position of the detector in the changing step is started before contacting the mold with the imprint material in the contacting step,
wherein the contacting of the mold with the imprint material in the contacting step is started before completing the changing of the position of the detector in the changing step,
where the detector is provided in plural,
wherein the detectors includes a detector that is displaced, and a detector that is not displaced, in the changing step, and
wherein the contacting step starts contacting the mold into the imprint material after one detector that is not displaced, among the detectors, detects the alignment mark, and another detector that is displaced, among the detectors, detects the alignment mark after completion of changing the position of the another detector.

* * * * *